US008853082B2

(12) United States Patent  
Hanano et al.

(10) Patent No.: US 8,853,082 B2  
(45) Date of Patent: Oct. 7, 2014

(54) POLISHING LIQUID FOR CMP AND POLISHING METHOD USING THE SAME

(75) Inventors: Masayuki Hanano, Hitachi (JP); Eiichi Satou, Hitachi (JP); Munehiro Oota, Hitachi (JP); Kanshi Chinone, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 13/519,809

(22) PCT Filed: Dec. 24, 2010

(86) PCT No.: PCT/JP2010/073452  
§ 371 (c)(1),  
(2), (4) Date: Aug. 16, 2012

(87) PCT Pub. No.: WO2011/081109  
PCT Pub. Date: Jul. 7, 2011

(65) Prior Publication Data  
US 2012/0315763 A1 Dec. 13, 2012

(30) Foreign Application Priority Data  
Dec. 28, 2009 (JP) .............................. P2009-297737

(51) Int. Cl.  
*H01L 21/302* (2006.01)

(52) U.S. Cl.  
USPC .......... 438/692; 438/691; 438/693; 252/79.1; 216/89

(58) Field of Classification Search  
USPC .............. 252/79.1, 79.2, 79.3, 79.4; 438/691, 438/692, 693, 694; 216/89, 90, 103  
See application file for complete search history.

(56) References Cited

U.S. PATENT DOCUMENTS

| 7,161,247 | B2* | 1/2007 | De Rege Thesauro et al. .............................. 257/741 |
| 7,998,335 | B2* | 8/2011 | Feeney et al. ................. 205/674 |
| 2005/0148290 | A1* | 7/2005 | De Rege Thesauro et al. . 451/41 |
| 2006/0024967 | A1 | 2/2006 | De Rege Thesauro et al. |
| 2006/0281196 | A1 | 12/2006 | Feeney et al. |
| 2009/0221213 | A1* | 9/2009 | Namie et al. .................... 451/36 |
| 2010/0015806 | A1 | 1/2010 | Fukasawa et al. |
| 2011/0275285 | A1 | 11/2011 | Satou et al. |

FOREIGN PATENT DOCUMENTS

| CN | 1993437 A | 7/2007 |
| CN | 101218378 A | 7/2008 |
| CN | 102232242 A | 11/2011 |
| JP | 03-256665 | 11/1991 |
| JP | 09-316431 | 12/1997 |
| JP | 10-102038 | 4/1998 |
| JP | 2008-518427 | 5/2008 |
| JP | 2008-288537 | 11/2008 |
| JP | 2008-544523 | 12/2008 |
| JP | 2009-272601 | 11/2009 |
| KR | 10-2009-0057249 A | 6/2009 |
| WO | 2006-023105 A1 | 3/2006 |
| WO | 2006/138110 A2 | 12/2006 |
| WO | 2010-067844 A1 | 6/2010 |

OTHER PUBLICATIONS

International Preliminary Report on Patentability issued in counterpart application PCT/JP2010/073452, completed Aug. 14, 2012 and mailed Aug. 23, 2012.  
International Search Report of PCT/JP2010/073452, completed Jan. 28, 2011 and mailed Feb. 8, 2011.  
Office Action issued in counterpart Chinese application 201080059718.8 on Aug. 23, 2013 (no translation available; submitted for certification).  
Office Action issued in counterpart Chinese application 201080059718.8 on Apr. 25, 2014 (no translation available; submitted for certification).  
Notice of Allowance issued in counterpart Korean application 10-2012-7019105 on Jun. 18, 2014 (no translation available; submitted for certification).

* cited by examiner

*Primary Examiner* — Lan Vinh

(74) *Attorney, Agent, or Firm* — Griffin & Szipl, P.C.

(57) ABSTRACT

An object of the present invention is to provide a polishing liquid for CMP with which polishing scratches can be reduced and a sufficiently high polishing rate can be obtained in a CMP step for an ILD film, aggregation of an abrasive grain is difficult to occur, and high flatness is obtained, and provide a polishing method using the same. The polishing liquid for CMP according to the present invention is a polishing liquid for CMP containing an abrasive grain, an additive, and water, wherein the abrasive grain comprises a cerium-based particle, and the additive comprises a 4-pyrone-based compound and at least one of a nonionic surfactant or a cationic surfactant:

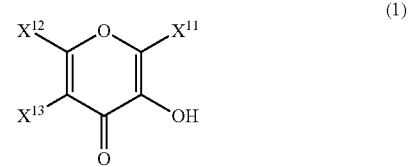

[wherein $X^{11}$, $X^{12}$, and $X^{13}$ each independently represent a hydrogen atom or a monovalent substituent].

39 Claims, 1 Drawing Sheet

(a)
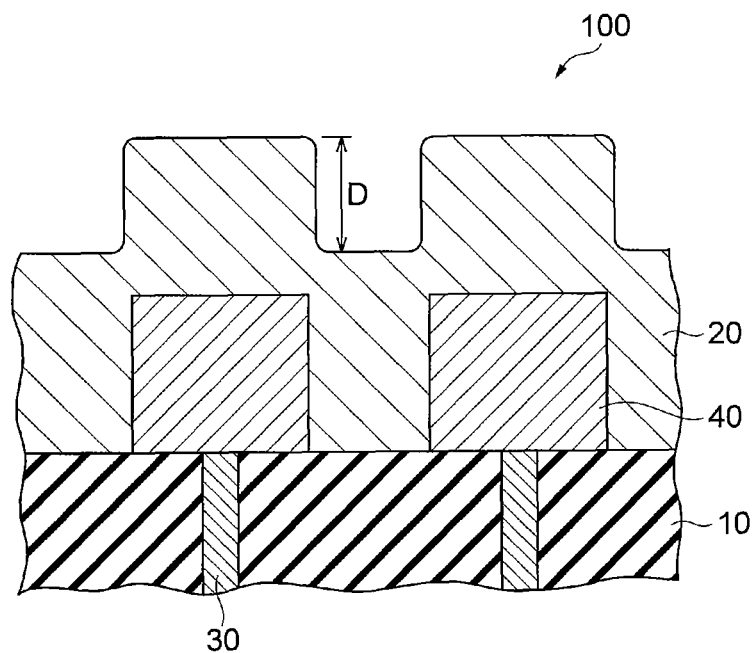
(b)
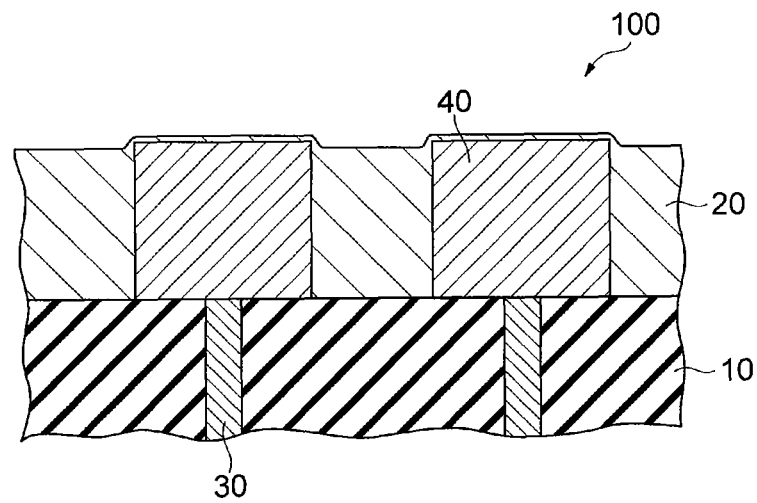

POLISHING LIQUID FOR CMP AND POLISHING METHOD USING THE SAME

This is a National Phase Application in the United States of International Patent Application No. PCT/JP2010/073452 filed Dec. 24, 2010, which claims priority on Japanese Patent Application No. P2009-297737, filed Dec. 28, 2009. The entire disclosures of the above patent applications are hereby incorporated by reference.

TECHNICAL FIELD

The present invention relates to a polishing liquid for CMP and a polishing method using the same, and particularly relates to a polishing liquid for CMP suitable for chemical mechanical polishing (CMP) of semiconductor wafer materials and a polishing method using the same.

BACKGROUND ART

In the field of production of semiconductors, along with higher performance of ultra LSI devices, a finer fabrication technique as an extension of the conventional technique has been reaching the limit of compatibility between higher integration and higher speed. Then, a technique for developing finer semiconductor elements and higher integration in the vertical direction, namely, a technique for multi-layering of a wiring has been developed.

One of the most important techniques in the process of producing devices in which wirings are multi-layered includes a CMP technique. The CMP technique is a technique for forming a thin film on a substrate by chemical vapor deposition (CVD) or the like, subsequently flattening the surface thereof. For example, a flattening treatment by the CMP is essential to ensure a focal depth in lithography. If depressions and projections exist on the surface of the substrate, inconveniences occur, for example, focusing in an exposing step becomes impossible, or a fine wiring structure cannot be sufficiently formed.

In the production process of the device, such a CMP technique is also applied in a step of forming an element separating region by polishing a plasma oxide film (BPSG, HDP-$SiO_2$, p-TEOS), or a step of forming an interlayer dielectric film or a step of embedding a film including silicon oxide in a metal wiring, subsequently flattening a plug (for example, Al—Cu plug).

The CMP is usually performed using an apparatus that can feed a polishing liquid to a polishing pad. The surface of the substrate is polished by pressing the substrate against the polishing pad while the polishing liquid is fed between the surface of the substrate and the polishing pad. Thus, the polishing liquid is one of component technologies in the CMP technique, and development of a variety of polishing liquids has been made in order to obtain a high performance polishing liquid (for example, see Patent Literature 1).

For example, a silicon dioxide film of several tens of thousands Å needs to be polished particularly in the CMP step for the interlayer dielectric film (ILD film) in an interlayer dielectric portion in the semiconductor among the steps in which the CMP technique as described above is applied. For this, in the CMP step for the ILD film, a silica-based polishing liquid having a high polishing rate is mainly used (see Patent Literature 2); in this case, because control of polishing scratches tends to be difficult, the polishing scratches are likely to occur; moreover, usually, mirror finishing polishing is not performed unlike the CMP step for the dielectric film for the element separating region.

However, along with the finer wiring these days, it is desired that the polishing scratch is minimized also in the CMP step for the ILD film. However, the conventional silica-based polishing liquid is difficult to control the polishing scratch as described above. On the other hand, it is known that the amount of polishing scratch is less in the case of the cerium-based polishing liquid than that of the silica-based polishing liquid (see Patent Literature 3), while a high polishing rate required in the CMP step for the ILD film, for example, tends to be difficult to attain.

CITATION LIST

Patent Literature

Patent Literature 1: Japanese Patent Application Laid-Open Publication No. 2008-288537
Patent Literature 2: Japanese Patent Application Laid-Open Publication No. 9-316431
Patent Literature 3: Japanese Patent Application Laid-Open Publication No. 10-102038

SUMMARY OF INVENTION

Technical Problem

As described above, recently, in the CMP step for the ILD film, a higher polishing rate is required, and enabling to lessen an occurrence of polishing scratches is required in order to handle with a finer wiring or the like. However, polishing liquid for CMP that can sufficiently demonstrate both of these properties has not been obtained. In the polishing liquid for CMP with a high polishing rate, conventionally, aggregation of the abrasive grain included therein tends to occur; however, it is desired that aggregation of the abrasive grain is as little as possible even if the polishing rate is high because aggregation of the abrasive grain is a cause of important problems such as change in the polishing rate and increase in the polishing scratch.

Then, the present invention has been made in consideration of such circumstances, and an object of the present invention is to provide a polishing liquid for CMP with which polishing scratches can be reduced and a sufficiently high polishing rate can be obtained in a CMP step for an ILD film, aggregation of the abrasive grain is difficult to occur, and high flatness is obtained, and provide a polishing method using the same.

Solution to Problem

As a result of repeated and extensive research on the components to be blended in a polishing liquid for CMP in order to achieve the object above, the present inventors found out that specific compounds are used in combination as an additive, and these are used in combination with a specific abrasive grain and water; thereby occurrence of polishing scratches can be suppressed while a high polishing rate can be attained, and high flatness can be obtained, and aggregation of the abrasive grain can be reduced. Thus, the present invention has been conceived.

Namely, a polishing liquid for CMP according to the present invention is a polishing liquid for CMP comprising an abrasive grain, an additive, and water, wherein the abrasive grain comprises a cerium-based particle, and the additive comprises a 4-pyrone-based compound represented by the following formula (1) and at least one of a nonionic surfactant or a cationic surfactant:

[Chemical Formula 1]

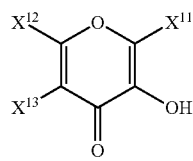

[wherein $X^{11}$, $X^{12}$, and $X^{13}$ each independently represent a hydrogen atom or a monovalent substituent.]

In the research of the polishing liquid for CMP, the present inventors prepared many polishing liquids using a variety of organic compounds as an additive, performed an evaluation of the polishing rate of an ILD film (silicon oxide film) by these polishing liquids, and performed measurement of the particle size of each polishing liquid over time in order to check presence of aggregation of the abrasive grain. As a result, it was found that if a 4-pyrone-based compound and at least one of a nonionic surfactant or a cationic surfactant are used as an additive, and the additive is combined with a cerium-based particle as the abrasive grain and water, a sufficiently high polishing rate is attained, and the amount of polishing scratches can be more reduced than in the case of using the silica-based polishing liquid in which a high polishing rate is conventionally obtained.

According to the research by the present inventors, it was found that the polishing liquid including only the 4-pyrone-based compound as the additive can demonstrate a sufficient polishing rate compared to the case of using the silica-based polishing liquid, while the so-called dishing, i.e., a phenomenon that a metal portion is polished faster to be dented like a dish in the case where an ILD film is formed between wirings made of a metal, for example, is likely to occur. Although a high polishing rate is obtained and the polishing scratch can be suppressed, flatness of the polished surface is impaired if such dishing occurs; therefore, the polishing liquid including only the 4-pyrone-based compound is not preferable.

Contrary to this, it was also found that in the polishing liquid for CMP according to the present invention, if at least one of a nonionic surfactant or a cationic surfactant is used in addition to the 4-pyrone-based compound as the additive, a high polishing rate is obtained, occurrence of the polishing scratch can be reduced, occurrence of the dishing is reduced to obtain high flatness.

Although the factor to attain the effect as described above by the polishing liquid for CMP according to the present invention is not always clear, the present inventors presume as follows. Namely, first, it is thought that the cerium-based particle is lower in hardness than the silica particle and the alumina particle, and by using the cerium-based particle as the abrasive grain, the polishing scratches which occur on the polished surface can be suppressed. It is thought that the 4-pyrone-based compound having the above specific structure can increase the interaction between the polishing liquid and the ILD film. For this, it is presumed that by combining the 4-pyrone-based compound, the polishing rate can be increased although the cerium-based particle whose hardness is low is used.

Further, it is thought that the nonionic surfactant and the cationic surfactant that are the other additives can protect the surface to be polished. For this, it is thought that by this protection effect, occurrence of the polishing scratch can be reduced, and depressed portions of the surface to be polished can be prevented from being polished while projected portions thereof are polished; as a result, high flatness can be obtained. While the 4-pyrone-based compound is an additive that can increase the interaction between the polishing liquid and the ILD film, the 4-pyrone-based compound has no effect of weakening a repulsive force such as the electrostatic repulsive force between the abrasive grains; and the nonionic surfactant and the cationic surfactant can enter the gap between the abrasive grains to repel the abrasive grains one another. Accordingly, it is thought that if these additives are included, aggregation of the abrasive grain can be suppressed. Note that the action is not limited to that above.

Thus, the polishing liquid for CMP according to the present invention provides a high polishing rate, and can suppress occurrence of the polishing scratch; therefore the polishing liquid is suitable for use in polishing the ILD film as described above.

As the 4-pyrone-based compound included in the polishing liquid for CMP according to the present invention, at least one compound selected from the group consisting of 3-hydroxy-2-methyl-4-pyrone, 5-hydroxy-2-(hydroxymethyl)-4-pyrone, and 2-ethyl-3-hydroxy-4-pyrone is preferred. If the 4-pyrone-based compound is these compounds, a higher polishing rate is obtained, and aggregation of the abrasive grain can be further suppressed.

As the nonionic surfactant, at least one surfactant selected from the group consisting of ether-type surfactants, ester-type surfactants, aminoether-type surfactants, ether ester-type surfactants, alkanolamide-type surfactants, polyvinylpyrrolidone, polyacrylamide, and polydimethylacrylamide is preferred. If these nonionic surfactants are included, higher flatness is likely to be obtained, and aggregation of the abrasive grain can be further suppressed. From such a viewpoint, as the nonionic surfactant, polyoxyethylene sorbitan monolaurate is particularly preferred.

It is preferable that the polishing liquid for CMP further includes a saturated monocarboxylic acid as an additive. If the saturated monocarboxylic acid is further included, the polishing rate of a flat surface can be improved without reducing the polishing rate of a surface having depressed and projected shape, or advantages are obtained such that uniformity within a plane that is an index of fluctuation of the polishing rate within a plane to be polished can be improved.

It is preferable that the saturated monocarboxylic acid be those having 2 to 6 carbon atoms. Thereby, further improvement in the polishing rate in a flat semiconductor substrate and a higher effect of improving uniformity within a plane are obtained.

As the saturated monocarboxylic acid, at least one compound selected from the group consisting of acetic acid, propionic acid, butyric acid, isobutyric acid, valeric acid, isovaleric acid, pivalic acid, hydrangelic acid, caproic acid, 2-methylpentanoic acid, 4-methylpentanoic acid, 2,3-dimethylbutanoic acid, 2-ethylbutanoic acid, 2,2-dimethylbutanoic acid, and 3,3-dimethylbutanoic acid is preferred.

Moreover, in the polishing liquid for CMP according to the present invention, it is preferable that the pH be less than 9, it is more preferable that the pH be less than 8, and it is still more preferable that the pH be less than 7. As the polishing liquid for CMP according to the present invention has a more suitable pH less than the upper limit value as above, aggregation of the abrasive grain in the polishing liquid for CMP tends to be readily suppressed. On the other hand, it is preferable that the pH of the polishing liquid for CMP be not less than 1.5, it is more preferable that the pH be not less than 2.0, and it is still more preferable that the pH be not less than 2.5. If the polishing liquid has such a suitable pH not less than the lower limit value, the interaction between the polishing liquid for CMP and the ILD film tends to be increased to readily obtain a high polishing rate. It is more preferable that the polishing liquid for CMP further contains a pH adjuster so as to have a pH in a suitable range.

In the polishing liquid for CMP according to the present invention, it is preferable that the content of the 4-pyrone-based compound as the additive be 0.01 to 5 parts by mass based on 100 parts by mass of the polishing liquid for CMP. Thereby, the effect of improving the polishing rate is obtained more efficiently.

Moreover, it is preferable that the content of at least one of the nonionic surfactant or the cationic surfactant as the other additive be 0.05 to 0.5 parts by mass based on 100 parts by mass of the polishing liquid for CMP. Thereby, the effect of improving the flatness while keeping a high polishing rate is more likely to be obtained.

Further, in the case where a saturated monocarboxylic acid is included as the additive, it is preferable that the content of the saturated monocarboxylic acid be 0.01 to 5 parts by mass based on 100 parts by mass of the polishing liquid for CMP. Thereby, the effect of improving the polishing rate of the flat surface and the effect of improving uniformity within a plane are obtained more efficiently.

It is preferable that the content of the abrasive grain be 0.01 to 10 parts by mass based on 100 parts by mass of the polishing liquid for CMP. Moreover, it is preferable that the average particle size of the abrasive grain be 50 to 500 nm. Further, it is preferable that the abrasive grain be a cerium-based particle comprising cerium oxide, and it is more preferable that the abrasive grain be a cerium-based particle comprising polycrystalline cerium oxide having a grain boundary. If the abrasive grain in the polishing liquid for CMP according to the present invention satisfies one or more of these conditions, the polishing rate of the ILD film is further improved, and occurrence of the polishing scratch can be suppressed more efficiently.

Moreover, the present invention provides a polishing method for polishing a substrate, the method comprising the step of feeding the polishing liquid for CMP according to the above present invention between the substrate and a polishing member, and polishing the substrate with the polishing member. According to the polishing method, because the polishing liquid for CMP according to the present invention above is used, aggregation of the abrasive grain is suppressed, a sufficiently high polishing rate of the substrate is attained, and occurrence of the polishing scratch can be reduced. Accordingly, the polishing method is suitable for polishing that requires a high speed, high flatness, and little polishing scratches such as polishing of the ILD film, and suitable for application of polishing a large amount of the ILD film in a short time. The polishing method according to the present invention is particularly suitable for polishing of substrates having a silicon oxide film on the surface thereof. Namely, in the polishing method according to the present invention, it is suitable that the substrate has a silicon oxide film on the surface thereof, the CMP polishing liquid is fed between the silicon oxide film on the substrate and the polishing member, and the silicon oxide film on the substrate is polished by the polishing member.

Advantageous Effects of Invention

According to the present invention, a polishing liquid for CMP in which polishing scratches can be reduced and a sufficiently high polishing rate can be obtained in a CMP step for an ILD film, aggregation of the abrasive grain is difficult to occur, and high flatness is obtained, and a polishing method using the same can be provided.

BRIEF DESCRIPTION OF DRAWINGS

[FIG. 1] is a schematic sectional view showing a step of polishing a silicon oxide film formed so as to cover a wiring.

DESCRIPTION OF EMBODIMENTS

Hereinafter, referring to the drawings when necessary, a suitable embodiment according to the present invention will be described.

<Polishing Liquid for CMP>

A polishing liquid for CMP according to the present embodiment (hereinafter, abbreviated to a "polishing liquid") contains an abrasive grain (polishing particle), an additive, and water, and including a 4-pyrone-based compound having a specific chemical structure and at least one of a nonionic surfactant or a cationic surfactant as the additive. Hereinafter, each component used for preparation of the polishing liquid will be described.

(Additives)

The polishing liquid for CMP includes at least a 4-pyrone-based compound and a nonionic surfactant or a cationic surfactant as the additive, and may contain other additives in combination. Further, a nonionic surfactant and a cationic surfactant may be contained in combination.

The 4-pyrone-based compound is a heterocyclic compound including an oxy group and a carbonyl group and having a 6-membered ring (γ-pyrone ring) structure in which the carbonyl group is located at a 4-position with respect to the oxy group. In the 4-pyrone-based compound in the present embodiment, a hydroxy group is bonded to a carbon atom adjacent to the carbonyl group in the γ-pyrone ring, and a substituent other than the hydrogen atom may be replaced in other carbon atom.

Such a 4-pyrone-based compound is a compound represented by the following formula (1):

[Chemical Formula 2]

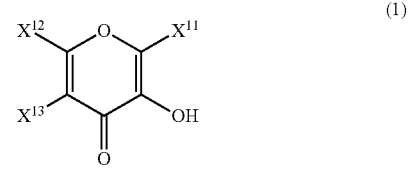

wherein $X^{11}$, $X^{12}$, and $X^{13}$ each independently represent a hydrogen atom or a monovalent substituent. Examples of the monovalent substituent include an aldehyde group, a hydroxyl group, a carboxyl group, a sulfonate group, a phosphate group, a bromine, chlorine, iodine, fluorine, a nitro group, a hydrazine group, a $C_1$ to $_8$ alkyl group (may be replaced by OH, COOH, Br, Cl, I, or $NO_2$), a hydroxyalkyl group, a $C_6$ to $_{12}$ aryl group, and a $C_1$ to $_8$ alkenyl group. Among these, suitable are a $C_1$ to $_8$ alkyl group (may be replaced by OH). Moreover, in the case where $X^{11}$, $X^{12}$, or $X^{13}$ is a monovalent substituent, it is preferable that the substituent be bonded to the carbon atom adjacent to the oxy group. Namely, it is preferable that $X^{11}$ or $X^{12}$ be a substituent. Further, it is preferable that among $X^{11}$, $X^{12}$, and $X^{13}$, at least two be a hydrogen atom.

As such a 4-pyrone-based compound, 3-hydroxy-2-methyl-4-pyrone and 5-hydroxy-2-(hydroxymethyl)-4-pyrone or 2-ethyl-3-hydroxy-4-pyrone are preferred. As the 4-pyrone-based compound, one of the compounds above may be used alone, or two or more thereof may be used in combination. If two or more of the 4-pyrone-based compounds are included in combination, a polishing rate of a flat substrate is improved, and the effect of improving the uniformity within a plane tends to be obtained. Examples of a suitable combination thereof, in the 4-pyrone-based compound represented by the above formula (1), include a combination of the 4-pyrone compound having an alkyl group as one of $X^{11}$, $X^{12}$, and $X^{13}$ and the 4-pyrone compound having a hydroxyalkyl group as one of $X^{11}$, $X^{12}$, and $X^{13}$.

It is preferable that the 4-pyrone-based compound be water soluble. If a compound whose solubility in water is high is used, a desired amount of the additive can be dissolved in the polishing liquid well to improve the polishing rate and attain the effect of suppressing aggregation of the abrasive grain at a higher level. In the 4-pyrone-based compound, it is preferable that solubility at normal temperature (25° C.) in 100 g of water be not less than 0.001 g, it is more preferable that the solubility be not less than 0.005 g, it is still more preferable that the solubility be not less than 0.01 g, and it is particularly preferable that the solubility be not less than 0.05 g. The upper limit of the solubility is not particularly limited.

Examples of the nonionic surfactant as the additive include ether-type surfactants, ester-type surfactants, aminoether-type surfactants, ether ester-type surfactants, alkanolamide-type surfactants, and water-soluble polymers such as polyvinylpyrrolidone, polyacrylamide, and polydimethylacrylamide. Among these, ester-type surfactants are preferable as the nonionic surfactant.

More specifically, examples of the ether-type surfactant include polyoxypropylene polyoxyethylene alkyl ether, polyoxyethylene lauryl ether, polyoxyethylene alkyl allyl ether, polyoxyethylene polyoxypropylene ether derivatives, polyoxypropylene glyceryl ether, polyethylene glycol, methoxypolyethylene glycol, and oxyethylene adducts of acetylene-based diols (Pluronic-type nonionic surfactant), polyoxyethylene cetyl ether, polyoxyethylene stearyl ether, polyoxyethylene oleyl ether, polyoxyethylene higher alcohol ether, polyoxyethylene octylphenyl ether, polyoxyethylene nonylphenyl ether, and polyoxyalkylene alkyl ether.

Examples of the ester-type surfactant include sorbitan fatty acid esters and glycerol borate fatty acid esters. Specifically, examples of the ester-type surfactant include polyoxyethylene sorbitan monolaurate, polyoxyethylene sorbitan monopalmitate, polyoxyethylene sorbitan monostearate, polyoxyethylene sorbitan tristearate, polyoxyethylene sorbitan monooleate, polyoxyethylene sorbitan trioleate, polyoxyethylene sorbit tetraoleate, polyethylene glycol monolaurate, polyoxyethylene glycol monostearate, polyoxyethylene glycol distearate, polyethylene glycol monooleate, and 2-hydroxyethylmethacrylate.

Examples of the aminoether-type surfactant include polyoxyethylene derivatives, and more specifically, include polyethylene cured castor oil and polyoxyethylene alkylamine. Examples of the ether ester-type surfactant include polyoxyethylene glycerol borate fatty acid esters and polyoxyethylene alkyl esters, and examples of the alkanolamide-type surfactant include alkyl alkanolamide, fatty acid alkanolamide and polyoxyethylene fatty acid alkanolamide.

In addition to polyvinylpyrrolidone, polyacrylamide, and polydimethylacrylamide as described above, examples of the water-soluble polymers include acrylic polymers such as polyvinyl alcohol, poly(N-(2-hydroxyethyl)acrylamide), and polyacryloylmorpholine, polyethylene glycol, polyoxypropylene, polyoxyethylene-polyoxypropylene condensates, and polyoxyethylene-polyoxypropylene block polymers of ethylenediamine.

As these nonionic surfactants, one of the compounds above may be used alone, or two or more thereof may be used in combination.

Examples of the cationic surfactants include surfactants such as coconut amine acetate and stearyl amine acetate, and polymer compounds such as polyethyleneimine, polyallylamine, polylysine, polydimethylacrylamide, chitosan, and derivatives thereof.

As the nonionic surfactant, among these, polyoxyethylene sorbitan monolaurate is preferred. If such a compound is included as the nonionic surfactant, a polished surface having particularly high flatness can be obtained, and aggregation of the abrasive grain can be further suppressed. The nonionic surfactant includes at least polyoxyethylene sorbitan monolaurate, and may include other compound in combination.

As the additives, in addition to the 4-pyrone-based compound and the nonionic surfactant, it is preferable that a saturated monocarboxylic acid be further included. Thereby, the polishing rate when the surface to be polished has depressions and projections is sufficiently obtained, and the polishing rate of the flat surface having no depression or projection can be improved. Usually, in polishing of the surface having depressions and projections, projected portions are polished with priority, and the surface to be polished becomes flat as polishing progresses; therefore, a polishing liquid which is excellent not only in the polishing rate of the surface to be polished having depressions and projections but also in the polishing rate of the surface to be polished having no depression or projection is suitable because a high polishing rate is obtained through the entire polishing step.

As the saturated monocarboxylic acid, compounds having 2 to 6 carbon atoms are suitable. For example, acetic acid, propionic acid, butyric acid, isobutyric acid, valeric acid, isovaleric acid, pivalic acid, hydrangelic acid, caproic acid, 2-methylpentanoic acid, 4-methylpentanoic acid, 2,3-dimethylbutanoic acid, 2-ethylbutanoic acid, 2,2-dimethylbutanoic acid, and 3,3-dimethylbutanoic acid are preferred. Among these, acetic acid and propionic acid are particularly preferred, and propionic acid is more preferred. As the saturated monocarboxylic acid, one of these compounds may be used alone, or two or more thereof may be used in combination.

(Abrasive Grain)

The polishing liquid for CMP according to the present embodiment includes a cerium-based particle comprising a cerium-based compound as the abrasive grain.

Such a polishing liquid using a cerium-based particle as the abrasive grain has a feature such that polishing scratches which occur in the polished surface can be relatively reduced. Conventionally, silica particles are widely used as the abrasive grain from the viewpoint of readily attaining a high polishing rate of the silicon oxide film that mainly forms the ILD film. However, usually, the polishing liquid using the silica particle has a problem such that polishing scratches are likely to occur on the polished surface. In a device having a fine pattern of a generation in which the width of the wiring is 45 nm, or later, even fine scratches, which are not problems conventionally, may affect reliability of the device.

On the other hand, in the polishing liquid using a particle including a cerium-based compound as the abrasive grain, the polishing rate of the silicon oxide film usually tends to be slightly lower than that using a silica particle. Contrary to this, in the present embodiment, because the specific additives above are added in combination, a high polishing rate of the ILD film (silicon oxide film) tends to be obtained although a cerium-based particle is used as the abrasive grain.

Examples of the cerium-based compound that constitutes the cerium-based particle include cerium oxide, cerium hydroxide, ammonium cerium nitrate, cerium acetate, cerium sulfate hydrates, cerium bromate, cerium bromide, cerium chloride, cerium oxalate, cerium nitrate, and cerium carbonate. Among these, it is preferable that a cerium oxide particle be used as the abrasive grain. If the cerium oxide particle is used, a high polishing rate can be attained, and a polished surface is obtained with less scratches and excellent flatness.

It is preferable that cerium oxide used as the abrasive grain include polycrystalline cerium oxide having a grain boundary. The polycrystalline cerium oxide particle with such a configuration has a property that active planes appear one after another at the same time when the particles become finer during polishing, and can keep a high polishing rate of the ILD film high.

Examples of a method for producing a cerium-based particle comprising cerium oxide include burning or an oxidation method using hydrogen peroxide or the like. In the case of the method by burning, it is preferable that the temperature during burning be 350 to 900° C. In the case where the produced cerium oxide particles aggregate, it is preferable to crush the aggregated particles mechanically. As the crushing method, for example, dry crushing by a jet mill or the like and a wet crushing method by a planetary bead mill or the like are preferred. For example, for a jet mill described in "Kagaku Kogaku Ronbunshuu," Vol. 6, No. 5, (1980), p.p. 527 to 532 can be used.

It is preferable that the average particle size of the abrasive grain be not less than 50 nm, it is more preferable that the average particle size be not less than 70 nm, and it is still more preferable that the average particle size be not less than 80 nm. At an average particle size of the abrasive grain not less than 50 nm, the polishing rate of the ILD film can be higher than that in the case of the average particle size less than 50 nm. On the other hand, it is preferable that the average particle size of the abrasive grain be not more than 500 nm, it is more preferable that the average particle size be not more than 300 nm, it is still more preferable that the average particle size be not more than 280 nm, it is particularly preferable that the average particle size be not more than 250 nm, and it is further more preferable that the average particle size be not more than 200 nm. At an average particle size not more than 500 nm, the polishing scratch can be suppressed more than in the case of the average particle size more than 500 nm.

Here, the average particle size of the abrasive grain means the median of volume distribution obtained by measuring a sample of a slurry in which the abrasive grains are dispersed by a dynamic light scattering particle size distribution analyzer, and is a value that can be measured using a LB-500® made by HORIBA, Ltd. or the like. For example, the abrasive grains are dispersed in water to adjust the concentration such that the content of the abrasive grain is 0.5 parts by mass based on 100 parts by mass of the sample, and the solution is set in the LB-500 to perform measurement of the median of the volume distribution. The degree of aggregation of the abrasive grain can be evaluated by measuring the median size (accumulated median) by the LB-500. In the case where the particle size of the abrasive grain is measured from the polishing liquid, a sample is prepared by adjusting the concentration of the polishing liquid such that the content of the abrasive grain is 0.5 parts by mass based on 100 parts by mass of the sample, and using this sample, measurement can be made by the same method.

(Water)

Water included in the polishing liquid is not particularly limited, and deionized water, ion exchange water, or ultrapure water is preferred. Further when necessary, a polar solvent such as ethanol, acetic acid, and acetone may be used in combination with water.

(Other Component)

The polishing liquid according to the present embodiment may further contain a component other than the components above to meet desired properties. Examples of such a component include a pH adjuster as described later, aminocarboxylic acid, and cyclic monocarboxylic acid. It is desirable that the amounts of these components to be added are in the ranges where the above effect of the polishing agent be not excessively reduced.

<Methods for Preparing and Using Polishing Liquid>

The polishing liquid containing the respective components above in combination is classified into (A) a normal type, (B) a condensed type, and (C) a two-liquid type, and the preparation method and the usage method are different according to the type. The (A) normal type is a polishing liquid that can be used as it is without performing a pre-treatment such as dilution during polishing. The (B) condensed type is a polishing liquid in which the contained components are condensed more than those of the (A) normal type in consideration of conveniences of storage and transport. The (C) two-liquid type is a polishing liquid that is in a separated state as a liquid A including a fixed component and a liquid B including other component during storage and transport, and used by mixing these liquids in use.

The (A) normal type can be obtained by dissolving or dispersing the above specific additive, the abrasive grain, and other component to be added when necessary in water as a main dispersing medium. For example, to prepare 1000 g of the polishing liquid in which the content of the abrasive grain is 0.5 parts by mass and the content of the additive is 0.1 parts by mass based on 100 parts by mass of the polishing liquid, the blending amount may be adjusted such that the content of the abrasive grain is 5 g and the content of the additive is 1 g based on the total amount of the polishing liquid.

Preparation of the polishing liquid can be performed, for example, using a stirrer, a homogenizer, an ultrasonic dispersing machine, a wet ball mill, or the like. To make the average particle size of the abrasive grain in a desired range, a treatment to form the abrasive grains into fine particles may be performed in the process to prepare the polishing liquid. The treatment to form the abrasive grains into fine particles can be performed by a sediment classification method or a method using a high pressure homogenizer. The sediment classification method is a method comprising a step of forcible sedimentation of a slurry including the abrasive grain by a centrifuge and a step of extraction of only a supernatant solution. On the other hand, the method using a high pressure homogenizer is a method for colliding the abrasive grains in the dispersing medium at a high pressure.

It is preferable that the content of the 4-pyrone-based compound as one of the additives in the polishing liquid be not less than 0.01 parts by mass based on 100 parts by mass of the polishing liquid, it is more preferable that the content be not less than 0.02 parts by mass, and it is still more preferable that the content be not less than 0.03 parts by mass. At an amount of the additive not less than 0.01 parts by mass, a stable polishing rate tends to be obtained than in the case of less than 0.01 parts by mass. On the other hand, it is preferable that the content of the additive be not more than 5 parts by mass, it is more preferable that the content be not more than 3 parts by mass, it is still more preferable that the content be not more than 1 part by mass, and it is particularly preferable that the content be not more than 0.5 parts by mass. At an amount of the additive not more than 5 parts by mass, aggregation of the abrasive grain is more likely to be suppressed and a higher polishing rate tends to be obtained than in the case of more than 5 parts by mass.

Moreover, it is preferable that the content of the nonionic surfactant as the other additive in the polishing liquid be not less than 0.05 parts by mass based on 100 parts by mass of the polishing liquid for CMP, it is more preferable that the content be not less than 0.1 parts by mass, and it is still more preferable that the content be not less than 0.2 parts by mass. At a content of the nonionic surfactant not less than 0.05 parts by mass, higher flatness is obtained and aggregation of the abrasive grain tends to be suppressed than in the case of less than 0.05 parts by mass. On the other hand, it is preferable that the content of the nonionic surfactant be not more than 0.5 parts by mass, and it is particularly preferable that the content be not more than 0.2 parts by mass. At a content of the nonionic surfactant not more than 0.5 parts by mass, a higher polishing rate tends to be obtained than in the case of more than 0.5 parts by mass.

Moreover, it is preferable that the content of the saturated monocarboxylic acid as an additive to be added to the polishing liquid when necessary be not less than 0.01 parts by mass based on the 100 parts by mass of the polishing liquid, it is more preferable that the content be not less than 0.05 parts by mass, it is still more preferable that the content be not less than 0.1 parts by mass, and it is further more preferable that the content be not less than 0.2 parts by mass. At an amount of the saturated monocarboxylic acid not less than 0.01 parts by mass, a stable polishing rate and high uniformity within a plane tend to be attained than in the case of less than 0.01 parts by mass. On the other hand, it is preferable that the content of the saturated monocarboxylic acid be not more than 5 parts by mass, it is more preferable that the content be not more than 3 parts by mass, it is still more preferable that the content be not more than 2 parts by mass, and it is particularly preferable that the content be not more than 1 part by mass. At an amount of the saturated monocarboxylic acid not more than 5 parts by mass, aggregation of the abrasive grain is more likely to be suppressed and a higher polishing rate and higher uniformity within a plane tend to be attained than in the case of more than 5 parts by mass.

It is preferable that the content of the abrasive grain included in the polishing liquid (concentration of the particle) be not less than 0.01 parts by mass based on 100 parts by mass of the polishing liquid, it is more preferable that the content be not less than 0.1 parts by mass, it is still more preferable that the content be not less than 0.15 parts by mass, it is further more preferable that the content be not less than 0.2 parts by mass, and it is particularly preferable that the content be not less than 0.25 parts by mass. At an amount of the abrasive grain not less than 0.01 parts by mass, a higher polishing rate tends to be attained than in the case of less than 0.01 parts by mass. On the other hand, it is preferable that the content of the abrasive grain be not more than 10 parts by mass, it is more preferable that the content be not more than 5.0 parts by mass, it is still more preferable that the content be not more than 3.0 parts by mass, it is particularly preferable that the content be not more than 2.0 parts by mass, and it is further more preferable that the content be not more than 1.0 part by mass. At an amount of the additive not more than 10 parts by mass, aggregation of the abrasive grain is more likely to be suppressed and a higher polishing rate tends to be attained than in the case of more than 10 parts by mass.

It is preferable that the pH of the polishing liquid be less than 9.0, it is more preferable that the pH be less than 8.0, it is still more preferable that the pH be less than 7.0, and it is particularly preferable that the pH be not more than 6.0. At a pH less than 9.0, aggregation of the abrasive grain is more likely to be suppressed and the effect of adding the above additives tends to be obtained than in the case of not less than 9.0. On the other hand, it is preferable that the pH of the polishing liquid be not less than 1.5, it is more preferable that the pH be not less than 2.0, and it is still more preferable that the pH be not less than 2.5. At a pH not less than 1.5, the absolute value of the zeta potential of the ILD film can be larger value than in the case of less than 1.5, which tends to be able to increase the interaction between the polishing liquid and the ILD film.

In addition to the effects above, it is thought that the following two effects are obtained by adjusting the pH of the polishing liquid in a suitable range of 1.5 to 9.0 in such a manner.

(1) A proton or a hydroxy anion acts on the compound blended as the additive to change a chemical form of the compound as the additive, and wettability and affinity of the silicon oxide film that is the ILD film on the surface to be polished are improved; thereby, a high polishing rate is obtained.

(2) In the case where the abrasive grain is a cerium-based particle comprising cerium oxide, the contact efficiency between the abrasive grains and the ILD film is improved in the above pH range to attain a high polishing rate. This is because the sign of the zeta potential is positive in cerium oxide while the sign of the zeta potential is negative in the silicon oxide film as the ILD film, and electrostatic attraction acts between these.

Because the pH of the polishing liquid can change according to the type of the compound to be used as the additive, a pH adjuster may be contained in the polishing liquid to adjust the pH in the range. The pH adjuster is not particularly limited, and examples thereof include acids such as nitric acid, sulfuric acid, hydrochloric acid, phosphoric acid, boric acid, and acetic acid, and bases such as sodium hydroxide, aqueous ammonia, potassium hydroxide, and calcium hydroxide. In the case where the polishing liquid originally has a suitable pH, from the viewpoint of improving productivity, the polishing liquid may be prepared without using any pH adjuster, and the polishing liquid may be applied for CMP as it is.

The (B) condensed type is diluted with water immediately before use such that the content of the contained component is a desired content. After dilution, stirring may be performed for arbitrary time until the same liquid properties (for example, the pH and the particle size of the abrasive grain) and polishing properties (for example, the polishing rate of the ILD film) as those of the (A) normal type are obtained. Because the volume is smaller according to the degree of condensation in such a (B) condensed type, costs of storage and transport can be reduced.

It is preferable that the factor of condensation be not less than 1.5 times, it is more preferable that the factor of condensation be not less than 2 times, it is still more preferable that the factor of condensation be not less than 3 times, and it is particularly preferable that the factor of condensation be not less than 5 times. At a factor of condensation not less than 1.5 times, merits on storage and transport tend to be obtained than in the case of less than 1.5 times. On the other hand, it is preferable that the factor of condensation be not more than 40 times, it is more preferable that the factor of condensation be not more than 20 times, and it is particularly preferable that the factor of condensation be not more than 15 times. At a factor of condensation not more than 40 times, aggregation of the abrasive grain tends to be suppressed than in the case of more than 40 times.

In use of the (B) condensed type polishing liquid, the pH changes before and after dilution with water. Accordingly, to prepare the polishing liquid having the same pH as that of the (A) normal type from the (B) condensed type, considering increase in the pH caused by mixing with water, the pH of the polishing liquid of the condensed type may be set lower in advance. For example, in the case where the (B) condensed type polishing liquid at a pH of 4.0 is diluted 10 times using water in which carbon dioxide is dissolved (pH: approximately 5.6), the pH is increased to approximately 4.3 in the polishing liquid after dilution.

From the viewpoint of obtaining a polishing liquid of a suitable pH after dilution with water, it is preferable that the pH of the (B) condensed type be 1.5 to 7.0. It is more preferable that the upper limit of the pH be 2.0, and it is still more preferable that the upper limit be 2.5. From the viewpoint of suppressing aggregation of the abrasive grain, it is preferable that the lower limit of the pH be 7.0, it is more preferable that the lower limit be 6.7, and it is still more preferable that the lower limit be 6.0, and it is particularly preferable that the lower limit be 5.5.

The (C) two-liquid type is advantageous in that the liquid A and the liquid B are suitably separated to avoid aggregation of the abrasive grain or the like compared to the (B) condensed type. The components contained in the liquid A and the liquid B, respectively, are arbitrary. For example, a slurry including the abrasive grain and the nonionic surfactant can be the liquid A, while a liquid including the 4-pyrone-based compound and other component to be blended when necessary can be the liquid B. In this case, in order to enhance dispersibility of the abrasive grain in the liquid A, any acid or alkali may be blended with the liquid A to perform the pH adjustment.

The (C) two-liquid type polishing liquid is useful in the case of combining the components that tend to cause the polishing properties to be reduced by aggregation of the abrasive grain or the like in a relatively short time if mixed. From the viewpoint of reduction in cost of storage and transport, at least one of the liquid A and the liquid B may be the condensed type. In this case, in use of the polishing liquid, the liquid A, the liquid B, and water may be mixed. The factor of condensation and pH of the liquid A or the liquid B are arbitrary, the liquid properties and polishing properties of the final mixture may be the same as those of the (A) normal type polishing liquid.

<Polishing Method>

A polishing method according to the present embodiment uses the above polishing liquid (polishing liquid for CMP) according to the embodiment, in which a substrate having a silicon oxide film on the surface thereof is flattened by the CMP technique. Specifically, the method comprises the step of feeding the polishing liquid according to the above embodiment between the silicon oxide film on the substrate having a silicon oxide film on the surface thereof and a predetermined member for polishing (polishing member), and polishing the silicon oxide film by the polishing member in this state.

The polishing method according to the present embodiment is suitable for polishing the substrate having a silicon oxide film on the surface thereof in the production process of the device as follows. Examples of the device include discrete semiconductors such as diodes, transistors, compound semiconductors, thermistors, varistors, and thyristors; memory elements such as DRAMs (dynamic random access memories), SRAMs (static random access memories), EPROMs (erasable programmable read only memories), mask ROMs (mask read only memories), EEPROMs (electrical erasable programmable read only memories), and flash memories; logic circuit elements such as microprocessors, DSPs, and ASICs; integrated circuit elements such as compound semiconductors represented by MMICs (monolithic microwave integrated circuits); hybrid integrated circuits (hybrid ICs); and photoelectric conversion elements such as light emission diodes and charge coupled devices.

According to the polishing liquid according to the present embodiment above, a high polishing rate is obtained while the polishing scratches are suppressed, and the high polishing rate tends to be obtained not largely depending on the shapes of the depressions and projections in the surface to be polished. For this, the polishing method using the polishing liquid can also be applied for the surface to be polished in which a high polishing rate is difficult to attain by the method using the conventional polishing liquid for CMP.

Particularly, the polishing method according to the present embodiment is suitable for flattening of the surface to be polished having differences (depressions and projections) on the surface. Examples of substrates having such a surface to be polished include semiconductor devices for logic. Moreover, the polishing method is suitable for polishing of the surface including a portion in which a depressed portion or projected portion is T-shaped or grid-shaped viewed from above. For example, a silicon oxide film provided on the surface of a semiconductor device having memory cells (for example, DRAMs, flash memories) can be polished at a high rate. In these, a high polishing rate is difficult to attain by the method using the conventional polishing liquid for CMP, and capability of performing the polishing of these at high speed shows that the polishing liquid for CMP according to the present invention can attain a high polishing rate without largely depending on the shapes of the depressions and projections in the surface to be polished.

The substrate for which the polishing method can be applied is not limited to those on which only a silicon oxide film is formed across the surface of the substrate; it may be those having, in addition to a silicon oxide film, a silicon nitride film, polycrystalline silicon film, or the like on the surface of the substrate. The polishing method can also be applied for the substrates in which a silicon oxide film, an inorganic insulating film made of glass or silicon nitride or the like, and a film mainly containing polysilicon, Al, Cu, Ti, TiN, W, Ta, or TaN is formed on a wiring board having a predetermined wiring.

Here, examples of a method for forming a silicon oxide film to be polished by the polishing liquid on the surface of the substrate include a low pressure CVD method and a plasma CVD method. In formation of the silicon oxide film by the low pressure CVD method, monosilane ($SiH_4$) is used as a Si source and oxygen ($O_2$) is used as an oxygen source. The $SiH_4$—$O_2$ oxidation reaction is made at a low temperature of not more than 400° C. to form a silicon oxide film. Depending on the cases, a heat treatment at a temperature of 1000° C. or less is performed after CVD.

The plasma CVD method has a merit in that a chemical reaction that needs a high temperature under ordinary heat equilibrium can be made at a low temperature. Examples of a method for generating plasma include two methods of a capacitively coupling type and an inductively coupling type. Examples of the reaction gas include $SiH_4$—$N_2O$ gases using $SiH_4$ as the Si source and $N_2O$ as the oxygen source, and TEOS-$O_2$ gases using tetraethoxysilane (TEOS) as the Si source (TEOS-plasma CVD method). It is preferable that the temperature of the substrate be in the range of 250 to 400° C. and the reaction pressure be in the range of 67 to 400 Pa.

To attain surface flattening by a high temperature reflow, the silicon oxide film may be doped with phosphorus (P). In this case, it is preferable that the $SiH_4$—$O_2$—$PH_3$ reaction gas be used. Thus, the silicon oxide film to be polished may be doped with an element such as phosphorus and boron.

In the case where a silicon nitride film is formed with the silicon oxide film, the silicon nitride film can also be formed by the low pressure CVD method, the plasma CVD method, or the like as well as the silicon oxide film. In the low pressure CVD method, dichlorosilane ($SiH_2Cl_2$) is used as the Si source and ammonia ($NH_3$) is used as the nitrogen source. The $SiH_2Cl_2$—$NH_3$ oxidation reaction is made at a high temperature of 900° C. to form a silicon nitride film. In the plasma CVD method, the $SiH_4$—$NH_3$ gas using $SiH_4$ as the Si source and $NH_3$ as the nitrogen source can be applied as the reaction gas. In this case, it is preferable that the temperature of the substrate be 300° C. to 400° C.

Hereinafter, as one example of a process including the polishing method according to the present embodiment, a process to form an interlayer dielectric (ILD) structure by the CMP will be described. FIG. 1 is a schematic sectional view showing a step of polishing a silicon oxide film formed to cover a wiring, and showing a process to form an interlayer dielectric film between wirings in a semiconductor.

First, as shown in FIG. 1(a)A, a substrate 100 before polishing has a structure in which a wiring 40 is formed via an interlayer dielectric film 10 on a lower substrate (not shown) having a predetermined lower wiring (not shown), and a silicon oxide coating film 20 as an upper ILD film is formed so as to cover the wiring 40. Because the silicon oxide coating film 20 is formed on the interlayer dielectric film 10 on which the wiring 40 is formed, an upper portion of the wiring 40 is higher than other portion, thereby resulting in a difference D in the silicon oxide coating film 20. The wiring 40 is connected to a lower wiring or the like by a contact plug 30 formed so as to penetrate the interlayer dielectric film 10. As the interlayer dielectric film 10, those comprising a known material as the interlayer dielectric film can be applied without limitation, and it may be the one comprising silicon oxide.

In the polishing method according to the present embodiment, the difference D in the silicon oxide film 20 is eliminated to perform flattening and form the interlayer dielectric structure; for this, projected portions on the wiring 40 are polished by the CMP with priority and removed.

In the polishing method, the substrate 100 is disposed on the polishing pad such that the upper surface of the silicon oxide film 20 and the polishing pad contact each other, and the surface of the silicon oxide film 20 is polished by the polishing pad while the polishing liquid is fed between the silicon oxide film 20 and the polishing pad. More specifically, the surface to be polished of the silicon oxide film 20 (the surface to be polished) is pressed against the polishing pad that the polishing platen has, and the silicon oxide film 20 is polished by relatively moving the surface to be polished and the polishing pad while the polishing liquid is fed therebetween. Here, while examples as the polishing member include the polishing pad, those having a polishing function can be applied without particular limitation as the polishing member.

As a polishing apparatus used for such polishing, for example, an apparatus including a holder that holds the substrate 100, a polishing platen to which the polishing pad is attached, and means for feeding the polishing liquid onto the polishing pad is suitable. Examples of the polishing apparatuses include polishing apparatuses made by EBARA CORPORATION (model No.: EPO-111, EPO-222, F-REX200, and F-REX300) and polishing apparatuses made by Applied Materials, Inc. (trade names: Mirra 3400, Reflexion polisher). The polishing pad is not particularly limited, and for example, ordinary non-woven fabrics, foamed polyurethanes, porous fluorinated resins, and the like can be used. It is also preferable that the polishing pad be the one subjected to grooving such that the polishing liquid is held in the grooves.

The polishing condition is not particularly limited, and it is preferable from the viewpoint of preventing the substrate 100 from jumping out that the rotational rate of the polishing platen be not more than 200 $min^{-1}$. It is preferable from the viewpoint of suppressing the scratches in the polished surface that the pressure applied to the substrate 100 (process load) be not more than 100 kPa. It is preferable that the polishing liquid be continuously fed to the polishing pad by a pump or the like during polishing. The amount of the polishing liquid to be fed is not limited, and it is preferable that the surface of the polishing pad be always covered with the polishing liquid.

By this polishing, the projected portions on the wiring 40 in the silicon oxide coating film 20 are removed with priority, and the difference D is gradually eliminated; finally, as shown in FIG. 1(b), the height of the portion of the wiring 40 on the surface of the silicon oxide coating film 20 is substantially the same as that of other portion, and a silicon oxide coating film 20 (ILD film) having a flat surface is formed. After polishing is completed, it is preferable that the substrate 100 after polishing be sufficiently washed in running water, water droplets adhering onto the substrate 100 be shaken off using a spin dryer or the like and dried.

In the polishing method according to the present embodiment, the polishing liquid for CMP according to the present embodiment above is used; for this, a high polishing rate is obtained, occurrence of the polishing scratches can be significantly reduced, and the depressions and projections of the surface can be eliminated to obtain a flat surface all over the substrate 100. By using the polishing liquid for CMP, a high polishing rate is kept while the surface to be polished gradually becomes a flat surface by polishing the depressed and projected surface. Further, if polishing is performed until the wiring 40 is exposed, occurrence of the dishing or the like can be extremely reduced.

In the present invention, moreover, the respective steps of the formation of the interlayer dielectric film 10, the formation of the wiring 40, the formation of the silicon oxide film 20, and the polishing by CMP as described above can be repeated the predetermined number of times to produce a multi-layered substrate 100 having the desired number of layers.

Thus, a variety of substrates 100 usable as various electronic parts can be obtained. Specific examples of the electronic parts include semiconductor elements, optical glasses such as photomasks, lenses, and prisms, inorganic conductive films such as ITO, optical integrated circuits, optical switching elements, and optical waveguides comprising glass and a crystalline material, end faces of optical fibers, optical single-crystals such as scintillators, solid-state laser single-crystals, sapphire substrates for blue laser LEDs, semiconductor single-crystals of SiC, GaP, or GaAs, glass substrates for magnetic disks, and magnetic head.

EXAMPLES

Hereinafter, the present invention will be described more in detain using Examples, but the present invention will not be limited to these Examples.

(Production of Abrasive Grain)

A powder comprising a cerium-based particle as the abrasive grain used in Examples below was produced. Namely, first, 40 kg of cerium carbonate hydrate was divided into ten, placed in ten of alumina containers, respectively, and burned at 830° C. for 2 hours in the air to obtain 20 kg of yellow white powder in total. The powder was subjected to phase identification by an X ray diffraction method, and it was found that the powder includes polycrystalline cerium oxide. The particle size of the powder obtained by burning was observed by SEM, and it was in the range of 20 to 100 μm. Next, 20 kg of the cerium oxide powder thus obtained was dry crushed using a jet mill. In the cerium oxide powder after crushing, the specific surface area was 9.4 $m^2$/g. The measurement of the specific surface area was performed by the BET method.

(Preparation of Slurry Including Abrasive Grain)

15.0 kg of the cerium oxide powder obtained above and 84.7 kg of deionized water were placed in a container, and mixed; further, 0.3 kg of 1N acetic acid was added, and the solution was stirred for 10 minutes to obtain a cerium oxide mixed solution. The obtained cerium oxide mixed solution was fed to another container over 30 minutes. During feeding the solution, an ultrasonic was applied to the cerium oxide mixed solution within a pipe for feeding the solution at an ultrasonic frequency of 400 kHz.

800 g±8 g of the cerium oxide mixed solution fed while an ultrasonic irradiation was applied thereto was placed in each of four 1000-mL beakers. The cerium oxide mixed solution within each of the beakers was subjected to centrifugation for 20 minutes on the condition such that the centrifugal force applied to the outer periphery was 500 G. After centrifugation, the supernatant fraction in the beaker was extracted to obtain a slurry (A). The obtained slurry (A) included approximately 10.0% by mass of cerium oxide particles based on the total mass.

The thus-obtained slurry (A) was diluted with pure water such that the content of the abrasive grain (cerium particle) was 0.5% by mass based on the total mass, and the diluted slurry was used as a sample for measurement of the particle size. In the sample, the average particle size of the abrasive grain was measured using a dynamic light scattering particle size distribution analyzer (made by HORIBA, Ltd., R: LB-500); as a result, the average particle size was 150 nm.

Reference Test Example 1

First, in order to check the effect of the 4-pyrone-based compound included in the polishing liquid (polishing liquid for CMP), Sample Nos. 1 to 19 of a variety of polishing liquids below were produced, and these properties were evaluated.

(Preparation of Polishing Liquid 1; Sample Nos. 1 to 19)

The polishing liquids of Sample Nos. 1 to 10 were those prepared using a variety of 4-pyrone-based compounds as the additive, while the polishing liquids of Sample Nos. 11 to 19 were those prepared using a compound that was not the 4-pyrone-based compound as the additive. The types of additives and other component in the respective polishing liquids were as shown in Tables 1 and 2 below.

In production of the polishing liquid, first, each type of additives shown in Tables 1 and 2 was dissolved in a predetermined amount of deionized water such that the corresponding concentration of the additive in the polishing liquid shown in Tables 1 and 2 was finally obtained, thereby to obtain an additive solution (B). Next, the additive solution (B) was mixed with the slurry (A) in the same amount, and the mixture was stirred over 10 minutes. Thereby, polishing liquids (C) whose condensed state was varied were obtained. In the polishing liquid (C) in the condensed state, 5% by mass of the abrasive grain (cerium oxide particle) based on the total mass and the additive whose concentration is 10 times the corresponding concentration in those shown in Tables 1 and 2 are included.

Each of the thus-prepared polishing liquids (C) whose condensed states were 19 types was diluted with water 10 times; next, adjusted such that 2.5% aqueous ammonia ($NH_4OH$) or 1N diluted nitric acid ($HNO_3$) was added as the pH adjuster to obtain the corresponding pH (polishing liquid pH) shown in Tables 1 and 2. Thereby, polishing liquids of Sample Nos. 1 to 19 were obtained. Because the amount of the pH adjuster to be added is faint, the pH adjuster does not affect the concentration of other component; even after addition of the pH adjuster, the concentration of the abrasive grain in the obtained polishing liquid was 0.5% by mass based on the total mass, and the concentration of the additive is the corresponding concentration shown in Tables 1 and 2.

(Evaluation of Properties)

Using the polishing liquids of Sample Nos. 1 to 19, the polishing of the silicon oxide film was performed as follows, the polishing rate was measured, and a tendency of aggregation of the abrasive grain included in the respective polishing liquids was evaluated.

(1) Measurement of Polishing Rate of Silicon Oxide Film

First, a DRAM pattern test wafer of φ200 mm having silicon oxide film on the surface (DRAM wafer, made by Praesagus. Inc., model No.: PCW-STI-811) was prepared. The DRAM wafer has a silicon oxide film with fine depressions and projections, a projected portion has an initial difference approximately 500 nm higher than a depressed portion, and the initial film thickness of the silicon oxide is approximately 600 nm. The wiring covered with the silicon oxide film is formed with lines parallel to a grid shape.

Using the polishing liquids of Sample Nos. 1 to 19, the silicon oxide film in the above DRAM wafer was polished. Polishing was performed using a polishing apparatus (made by Applied Materials, Inc., trade name: Mirra 3400). First, the above DRAM wafer was set on a holder having an adsorption pad for attaching the substrate in the polishing apparatus. On the other hand, a polishing pad made of a porous urethane resin (k-groove, made by Rohm and Haas Company, model No.: IC-1400) was attached to a polishing platen with a diameter of 500 mm as a polishing member.

Then, the above holder was placed on the polishing pad such that the side of the silicon oxide film of the DRAM wafer faced downward. At this time, an inner tube pressure, a retainer ring pressure, and a membrane pressure were set at 28 kPa, 38 kPa, and 28 kPa, respectively.

The silicon oxide film was polished for 60 seconds by rotating the polishing platen and the DRAM wafer at 93 $min^{-1}$ and at 87 $min^{-1}$ respectively, while the polishing liquid was dropped at a flow rate of 200 mL/min onto the polishing pad attached to the polishing platen. After that, the wafer after polishing was washed well with pure water using a PVA brush (polyvinyl alcohol brush), and dried.

In the above polishing step, using an ellipsometric film thickness measurement apparatus (made by Dainippon Screen Mfg. Co., Ltd., trade name: RE-3000), change in the film thickness of the silicon oxide film before and after polishing was measured, and the polishing rate was calculated from the time needed for polishing and the amount of change in the film thickness. The measurement point of the film thickness was projected portions written as "A" that were a 70 um square located in the vicinity of (x[mm],y[mm])=(7.0, −3.6), (31.0, −3.6), (55.0, −3.6), (79.0, −3.6) in the coordinate of the above DRAM wafer, and the polishing rate was determined using the average of the amount of change in the film thickness in these 4 points. The obtained results are shown as the polishing rate (pattern polishing rate) in Tables 1 and 2.

(2) Evaluation of Tendency of Aggregation

Measurement of the particle size of the abrasive grain in the polishing liquids of Sample Nos. 1 to 19 was performed on two types of the polishing liquids left for one hour after prepared and the polishing liquids that were stored at 25° C., and prepared 10 days ago. The measurement of the particle size was performed using a dynamic light scattering particle size distribution analyzer (made by HORIBA, Ltd., trade name: LB-500).

In the measurement, the above polishing liquid (C) in the condensed state corresponding to each sample was diluted 10 times 5 minutes before the measurement was started, and the average particle size of the thus-obtained polishing liquid was measured. The average particle size is 150 nm when the solution including no additive is used; therefore, considering the measurement error by the apparatus, it can be determined that aggregation of the particles occurs when the average particle size exceeds 200 nm.

TABLE 1

| | Additive | | Concentration of additive (% by mass) | Concentration of abrasive grain (% by mass) | pH of polishing liquid | Pattern polishing rate (nm/min) | Average particle size | |
|---|---|---|---|---|---|---|---|---|
| No. | Name | Structural formula | | | | | 1 hour after preparation | 10 days after preparation |
| 1 | 3-Hydroxy-2- | | 0.03 | 0.5 | 4.6 | 130 | 150 | 150 |
| 2 | methyl-4 | | 0.08 | 0.5 | 4.6 | 170 | 152 | 155 |
| 3 | pyrone | | 0.08 | 0.5 | 3.5 | 140 | 153 | 154 |
| 4 | | | 0.08 | 0.5 | 6.5 | 180 | 150 | 153 |
| 5 | | | 0.08 | 0.5 | 8.5 | 200 | 154 | 155 |
| 6 | 5-Hydroxy-2- | | 0.05 | 0.5 | 4.2 | 150 | 152 | 154 |
| 7 | (hydroxymethyl)- | | 0.1 | 0.5 | 4.2 | 180 | 152 | 152 |
| 8 | 4-pyrone | | 0.2 | 0.5 | 4.2 | 190 | 153 | 154 |
| 9 | | | 0.05 | 0.5 | 3.5 | 130 | 158 | 157 |
| 10 | | | 0.05 | 0.5 | 5.5 | 180 | 152 | 154 |

TABLE 2

| | Additive | | Concentration of additive (% by mass) | Concentration of abrasive grain (% by mass) | pH of polishing liquid | Pattern polishing rate (nm/min) | Average particle size | |
|---|---|---|---|---|---|---|---|---|
| No. | Name | Structural formula | | | | | 1 hour after preparation | 10 days after preparation |
| 11 | 4-Hydroxy-6-methyl-2-pyrone | | 0.1 | 0.5 | 4.5 | 20 | 152 | 154 |
| 12 | Ascorbic acid | | 0.1 | 0.5 | 3.7 | 130 | 160 | 1210 |
| 13 | Catechol | | 0.1 | 0.5 | 6.5 | 150 | 180 | 1520 |

TABLE 2-continued

| No. | Additive Name | Additive Structural formula | Concentration of additive (% by mass) | Concentration of abrasive grain (% by mass) | pH of polishing liquid | Pattern polishing rate (nm/min) | Average particle size 1 hour after preparation | Average particle size 10 days after preparation |
|---|---|---|---|---|---|---|---|---|
| 14 | 4-Methylcatechol | (structure) | 0.1 | 0.5 | 6 | 150 | 175 | 1450 |
| 15 | Mellitic acid | (structure) | 0.1 | 0.5 | 2.8 | 20 | 330 | 2200 |
| 16 | 3-Methyl-5-pyrazolone | (structure) | 0.1 | 0.5 | 3.6 | 30 | 153 | 156 |
| 17 | 1H-benzotriazole-1-methanol | (structure) | 0.1 | 0.5 | 4.3 | 20 | 152 | 154 |
| 18 | 2,6-Pyridine dicarboxylic acid | (structure) | 0.1 | 0.5 | 3.0 | 40 | 250 | 1570 |
| 19 | Adenosine | (structure) | 0.1 | 0.5 | 6.1 | 20 | 153 | 154 |

As shown in Tables 1 and 2, it was found that the polishing liquids of Sample Nos. 1 to 10 including the 4-pyrone-based compound as the additive can polish the silicon oxide film at a higher rate than the polishing liquids of Sample Nos. 11 to 19, and no aggregation of the abrasive grain was found in the polishing liquid prepared 10 days ago.

Reference Test Example 2

To check the effect of the saturated monocarboxylic acid included as an additional additive in the polishing liquid (polishing liquid for CMP), Samples Nos. 20 to 29 of a variety of polishing liquids below were prepared, and these properties were evaluated.

(Preparation of Polishing Liquid 2; Sample Nos. 20-29)

The polishing liquids of Nos. 20 to 22 and 26 are those including only the 4-pyrone-based compound (hereinafter, referred to as a "first additive.") as the additive, while the polishing liquids of Nos. 23 to 25 and 27 to 29 are those containing, in addition to the 4-pyrone-based compound as the additive, the saturated monocarboxylic acid (hereinafter, referred to as a "second additive") as the additional additive.

The polishing liquids Nos. 20 to 29 were prepared in the same manner as in the "Preparation of polishing liquid 1" except that the type of the additive in each polishing liquid and the concentrations of the additive and the abrasive grain were as shown in Table 3 below. In Table 3, A of the first additives (4-pyrone-based compound) is 3-hydroxy-2-methyl-4-pyrone, and B is 5-hydroxy-2-(hydroxymethyl)-4-pyrone. In the case where the concentrations of both of these components are shown, it means that two types of the 4-pyrone-based compounds are included in combination.

(Evaluation of Properties)

Using the polishing liquids of Sample Nos. 20 to 29, the polishing of silicon oxide was performed as follows, the polishing rate was measured, and uniformity within a plane of the polished surface was evaluated. The obtained result is shown in Table 3.

(1) Measurement of Polishing Rate of Silicon Oxide Film

First, the measurement of the polishing rate of the silicon oxide film was performed by the same method as that in the above Reference Test Example 1 to determine the "pattern polishing rate."

Except for the followings, the measurement of the polishing rate of the silicon oxide film was performed by the same method as that in the above Reference Test Example 1 to determine a "no-pattern polishing rate." Namely, first, instead of the DRAM wafer, a φ200 mm blanket wafer having a silicon oxide film having the initial film thickness of approximately 1000 nm (made by Advantec Co., Ltd.) was used. The measurement was performed on the central point of the wafer and points located at an interval of 5 mm in the diameter direction from the central point, and performed on 41 points in total (the measurement point next to that at 95 mm from the center was a point at 97 mm from the center).

(2) Evaluation of Uniformity within Plane

A value obtained by dividing the standard deviation of the amount of change in the film thicknesses at the 41 points obtained by measurement of the above no-pattern polishing rate by the average value of the amount of change in the film thickness was multiplied by 100, and the determined value was defined as the uniformity within a plane.

In the polishing liquids Nos. 23 to 24 and 27 to 29, the no-pattern polishing rate is particularly improved compared to the polishing liquid No. 25 (the polishing liquid including formic acid having 1 carbon atom as the second additive). Usually, in polishing the wafer having depressions and projections, the projected portions are polished with priority, the surface to be polished becomes flat as the polishing progresses; accordingly, the polishing rate tends to be closer to the polishing rate of the blanket wafer. For this, the polishing liquid excellent not only in pattern polishing rate but also in the no-pattern polishing rate is suitable because a high polishing rate is obtained through the entire polishing step. From the result above, it turned out that addition of the saturated monocarboxylic acid having 2 to 6 carbon atoms as the second additive is particularly effective in obtaining such an effect.

Further, comparing the polishing liquids Nos. 20 to 22 and No. 26, these all include the 4-pyrone-based compound to obtain a sufficient pattern polishing rate; particularly in the polishing liquid Nos. 22 and 26 including two types of 4-pyrone-based compounds in combination, in addition to the pattern polishing rate, a high effect is obtained in the no-pattern polishing rate and the uniformity within a plane.

Test Example 1

In order to check the effect of the polishing liquid according to the present invention including both of the 4-pyrone-based compound and at least one of the nonionic surfactant or the cationic surfactant as the additive, Sample Nos. 30 to 48 of a variety of polishing liquids below were prepared, and these properties were evaluated.

TABLE 3

| No. | Concentration of first additive (% by mass) A | Concentration of first additive (% by mass) B | Second additive | Concentration of second additive (% by mass) | Concentration of abrasive grain (% by mass) | pH | Pattern polishing rate (nm/min) | No-pattern polishing rate (nm/min) | Uniformity within a plane (%) |
|---|---|---|---|---|---|---|---|---|---|
| 20 | 0 | 0.15 | None | 0 | 0.5 | 4.2 | 180 | 210 | 5.1 |
| 21 | 0.085 | 0 | None | 0 | 0.5 | 4.6 | 170 | 680 | 15.8 |
| 22 | 0.043 | 0.075 | None | 0 | 0.5 | 4.3 | 170 | 370 | 9.7 |
| 23 | 0.043 | 0.075 | Acetic acid | 0.5 | 0.5 | 3.3 | 170 | 470 | 4.2 |
| 24 | 0.043 | 0.075 | Propionic acid | 0.5 | 0.5 | 3.3 | 180 | 510 | 3.9 |
| 25 | 0.043 | 0.075 | Formic acid | 0.5 | 0.5 | 4.0 | 170 | 170 | 9.5 |
| 26 | 0.068 | 0.03 | None | 0 | 0.5 | 4.3 | 190 | 430 | 4.9 |
| 27 | 0.068 | 0.03 | Acetic acid | 0.5 | 0.5 | 3.3 | 190 | 550 | 4.6 |
| 28 | 0.068 | 0.03 | Propionic acid | 0.5 | 0.5 | 3.3 | 190 | 590 | 7.1 |
| 29 | 0.068 | 0.03 | Butyric acid | 0.5 | 0.5 | 3.3 | 190 | 530 | 3.7 |

First, as shown in Table 3, the polishing liquid No. 23 to 25 and the polishing liquid No. 27 to 29 including the saturated monocarboxylic acid as the second additive were compared to the polishing liquid No. 22 and polishing liquid No. 26 including no second additive; then, it was found that a sufficient polishing rate is obtained, a particularly high no-pattern polishing rate tends to be obtained, additionally, higher uniformity within a plane is obtained. From this, it turned out that the saturated monocarboxylic acid as the second additive is effective particularly in improvement in the no-pattern polishing rate and the uniformity within a plane.

(Preparation of Polishing Liquid 3; Sample Nos. 30 to 48)

The polishing liquid No. 30 contains only the 4-pyrone-based compound (first additive), the polishing liquid No. 31 contains, in addition to the 4-pyrone-based compound, the saturated monocarboxylic acid (second additive), the polishing liquid No. 32 contains, in addition to the 4-pyrone-based compound, a nonionic surfactant (hereinafter, referred to as a "third additive."), and the polishing liquids Nos. 33 to 47 contain all of the first to third additives in combination. The polishing liquid No. 48 is a polishing liquid in which a fumed silica slurry SS25 (made by Cabot Corporation) is diluted with deionized water at 1:1.

The polishing liquids Nos. 30 to 48 were prepared in the same manner as in the above "Preparation of polishing liquid 1" except that the type of the additive in each polishing liquid and the concentrations of the additive and the abrasive grain were as shown in Table 4 below. In Table 4, A of the first additives (4-pyrone-based compound) is 3-hydroxy-2-methyl-4-pyrone, B is 5-hydroxy-2-(hydroxymethyl)-4-pyrone, the second additive (saturated monocarboxylic acid) is propionic acid (3 carbon atoms).

(Evaluation of Properties)

Using the polishing liquids of Sample Nos. 30 to 48, the polishing of silicon oxide was performed as follows, the polishing rate was measured, and the difference and polishing scratches of the polished surface after polishing were measured. The obtained result is shown in Table 4.

(1) Measurement of Polishing Rate of Silicon Oxide Film

First, measurement of the polishing rate of the silicon oxide film was performed by the same method as that in the above Reference Test Example 1 to determine a "pattern polishing rate."

Moreover, instead of the DRAM wafer, using a φ200 mm ILD wafer (made by Hitachi, Ltd.), measurement of the polishing rate of the silicon oxide film was performed, and the "pattern polishing rate" was determined in the same manner as above. The ILD wafer has a silicon oxide film with fine depressions and projections on the surface, and has a silicon oxide film in which the height of a projected portion is approximately 4000 nm from a depressed portion. The wiring covered with the silicon oxide film is formed with parallel lines. Further, the measurement point of the film thickness was a wiring portion with projections and depressions of 500-500 nm in a chip in the center of the wafer. In Table 4, the pattern polishing rate obtained using the ILD wafer is shown.

(2) Measurement of Flatness

In order to measure the flatness of the polished surface after polishing, using a difference measurement apparatus (made by Kla-Tencor Corporation), the difference between the projection and the depression after polishing was measured.

(3) Measurement of Polishing Scratch

In order to measure the polishing scratch on the polished surface after polishing, using an SEM (made by Applied Materials, Inc.), the number of polishing scratches occurred per wafer was measured.

TABLE 4

| No. | Concentration of first additive (% by mass) A | B | Concentration of second additive (% by mass) | Third additive Kind | Name of substance | Concentration (% by mass) | Abrasive grain | Concentration of abrasive gain (% by mass) | Pattern polishing rate (nm/min) | Difference (nm/min) | Polishing scratches (the number of scratches/wafer) |
|---|---|---|---|---|---|---|---|---|---|---|---|
| 30 | 0.004 | 0.075 | 0 | — | — | — | Cerium oxide | 0.5 | 700 | 50 | 30 |
| 31 | 0.004 | 0.075 | 0.1 | — | — | — | Cerium oxide | 0.5 | 800 | 45 | 30 |
| 32 | 0.004 | 0.075 | 0 | Nonionic surfactant | Polyoxyethylene sorbitan monolaurate | 0.2 | Cerium oxide | 0.5 | 500 | 35 | 27 |
| 33 | 0.004 | 0.075 | 0.1 | Nonionic surfactant | Polyoxyethylene sorbitan monolaurate | 0.2 | Cerium oxide | 0.5 | 600 | 25 | 24 |
| 34 | 0.004 | 0.075 | 0.1 | Nonionic surfactant | Polyoxyethylene lauryl ether | 0.09 | Cerium oxide | 0.5 | 400 | 35 | 28 |
| 35 | 0.004 | 0.075 | 0.1 | Nonionic surfactant | Polyoxyethylene cetyl ether | 0.2 | Cerium oxide | 0.5 | 450 | 30 | 26 |
| 36 | 0.004 | 0.075 | 0.1 | Nonionic surfactant | Polyoxyethylene stearyl ether | 0.2 | Cerium oxide | 0.5 | 450 | 35 | 25 |
| 37 | 0.004 | 0.075 | 0.1 | Nonionic surfactant | Polyoxyethylene oleyl ether | 0.2 | Cerium oxide | 0.5 | 450 | 35 | 28 |
| 38 | 0.004 | 0.075 | 0.1 | Cationic surfactant | Stearyl amine acetate | 0.2 | Cerium oxide | 0.5 | 450 | 30 | 28 |
| 39 | 0.004 | 0.075 | 0.1 | Cationic surfactant | Coconut amine acetate | 0.2 | Cerium oxide | 0.5 | 450 | 35 | 29 |
| 40 | 0.004 | 0.075 | 0.1 | Nonionic surfactant | Polyvinyl alcohol | 0.2 | Cerium oxide | 0.5 | 450 | 35 | 28 |
| 41 | 0.004 | 0.075 | 0.1 | Nonionic surfactant | Polyvinylpyrrolidone | 0.2 | Cerium oxide | 0.5 | 450 | 35 | 25 |
| 42 | 0.004 | 0.075 | 0.1 | Nonionic surfactant | Polyethylene glycol | 0.2 | Cerium oxide | 0.5 | 450 | 30 | 28 |
| 43 | 0.004 | 0.075 | 0.1 | Cationic surfactant | Polyallylamine | 0.2 | Cerium oxide | 0.5 | 450 | 30 | 25 |
| 44 | 0.004 | 0.075 | 0.1 | Cationic surfactant | Chitosan | 0.2 | Cerium oxide | 0.5 | 450 | 35 | 26 |
| 45 | 0.004 | 0.075 | 0.1 | Cationic surfactant | Polyethyleneimine | 0.2 | Cerium oxide | 0.5 | 450 | 35 | 28 |
| 46 | 0.004 | 0.075 | 0.1 | Anionic surfactant | Polyoxyethylene alkyl ether sulfuric acid triethanolamine | 0.2 | Cerium oxide | 0.5 | Polishing cannot be evaluated due to aggregation of cerium oxide | | |
| 47 | 0.004 | 0.075 | 0.1 | Anionic polymer | Alginic acid | 0.2 | Cerium oxide | 0.5 | Polishing cannot be evaluated due to aggregation of cerium oxide | | |
| 48 | 0 | 0 | 0 | — | — | — | Fumed silica | 12.5 | 500 | 25 | 200 |

As shown in Table 4, it was found that according to the polishing liquids Nos. 32 to 45 including the 4-pyrone-based compound (first additive) and at least one of the nonionic surfactant or the cationic surfactant (third additive) in combination as the additives, a sufficient polishing rate is obtained, additionally, high flatness is obtained, and occurrence of the polishing scratch is reduced.

It was also found that, in the polishing liquids Nos. 46 and 47 including an anionic surfactant and an anionic polymer in combination, these additives aggregate cerium oxide. Contrary to this, it turned out that in the polishing liquid No. 48 using the conventional silica-based particle as the abrasive grain, although a high polishing rate is obtained, the polishing scratch is very likely to occur.

REFERENCE SIGNS LIST

10 . . . interlayer dielectric film, 20 . . . silicon oxide film, 30 . . . contact plug, 40 . . . wiring, 100 . . . substrate.

The invention claimed is:

1. A polishing method for polishing a substrate with a polishing liquid for CMP, the polishing method comprising the steps of:
   (A) providing a polishing liquid for CMP that comprises
      (I) an abrasive grain;
      (II) an additive; and
      (III) a water;
   wherein the abrasive grain comprises a cerium-based particle,
   wherein the additive comprises
      (a) a 4-pyrone-based compound represented by a following formula (1); and
      (b) at least one of a nonionic surfactant or a cationic surfactant

[Chemical Formula 1]

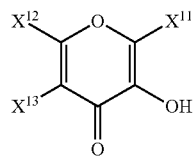

(1)

wherein $X^{11}$, $X^{12}$, and $X^{13}$ of formula (1) each independently represent a hydrogen atom or a monovalent substituent,
   wherein the nonionic surfactant is at least one surfactant selected from the group consisting of an ether-type surfactant, an ester-type surfactant, an aminoether-type surfactant, an ether ester-type surfactant, an alkanolamide-type surfactant, polyvinylpyrrolidone, polyacrylamide, and polydimethylacrylamide, and
   wherein a pH of the polishing liquid for CMP is less than 7;
   (B) providing a substrate and a polishing member,
   wherein the substrate has an insulating film on a surface of the substrate;
   (C) feeding the polishing liquid for CMP between the insulating film on the substrate and a polishing member; and
   (D) polishing the insulating film on the substrate with the polishing member.

2. The polishing method for polishing a substrate with a polishing liquid for CMP according to claim 1, wherein the 4-pyrone-based compound is at least one compound selected from the group consisting of 3-hydroxy-2-methyl-4-pyrone, 5-hydroxyl-2-(hydroxymethyl)-4-pyrone, and 2-ethyl-3-hydroxy-4-pyrone.

3. The polishing method for polishing a substrate with a polishing liquid for CMP according to claim 1, wherein the pH of the polishing liquid for CMP is not less than 1.5.

4. The polishing method for polishing a substrate with a polishing liquid for CMP according to claim 1, wherein the pH of the polishing liquid for CMP is not less than 2.0.

5. The polishing method for polishing a substrate with a polishing liquid for CMP according to claim 1, wherein the pH of the polishing liquid for CMP is not less than 2.5.

6. The polishing method for polishing a substrate with a polishing liquid for CMP according to claim 1, wherein the polishing liquid for CMP further comprises a pH adjuster.

7. The polishing method for polishing a substrate with a polishing liquid for CMP according to claim 1, wherein a content of the 4-pyrone-based compound of the polishing liquid for CMP is 0.01 to 5 parts by mass based on 100 parts by mass of the polishing liquid for CMP.

8. The polishing method for polishing a substrate with a polishing liquid for CMP according to claim 1, wherein a content of at least one of the nonionic surfactant or the cationic surfactant of the polishing liquid for CMP is 0.05 to 0.5 parts by mass based on 100 parts by mass of the polishing liquid for CMP.

9. The polishing method for polishing a substrate with a polishing liquid for CMP according to claim 1, wherein a content of the abrasive grain of the polishing liquid for CMP is 0.01 to 10 parts by mass based on 100 parts by mass of the polishing liquid for CMP.

10. The polishing method for polishing a substrate with a polishing liquid for CMP according to claim 1, wherein an average particle size of the abrasive grain of the polishing liquid for CMP is 50 to 500 nm.

11. The polishing method for polishing a substrate with a polishing liquid for CMP according to claim 1, wherein the cerium-based particle of the abrasive grain of the polishing liquid for CMP comprises cerium oxide.

12. The polishing method for polishing a substrate with a polishing liquid for CMP according to claim 1, wherein the cerium-based particle of the abrasive grain comprises polycrystalline cerium oxide that has a grain boundary.

13. The polishing method for polishing a substrate with a polishing liquid for CMP according to claim 1, wherein the insulating film is a silicon oxide film.

14. The polishing method for polishing a substrate with a polishing liquid for CMP according to claim 1, wherein a surface of the insulating film has a depression and a projection, and wherein the polishing step (D) flattens the surface of the insulating film.

15. The polishing method for polishing a substrate with a polishing liquid for CMP according to claim 1, further comprising:
   (c) a saturated monocarboxylic acid.

16. The polishing method for polishing a substrate with a polishing liquid for CMP according to claim 15, wherein the saturated monocarboxylic acid has 2 to 6 carbon atoms.

17. The polishing method for polishing a substrate with a polishing liquid for CMP according to claim 15, wherein the saturated monocarboxylic acid is at least one compound selected from the group consisting of acetic acid, propionic acid, butyric acid, isobutyric acid, valeric acid, isovaleric acid, pivalic acid, hydrangelic acid, caproic acid, 2-methylpentanoic acid, 4-methylpentanoic acid, 2,3-dimethylbutanoic acid, 2-ethylbutanoic acid, 2,2-dimethylbutanoic acid, and 3,3-dimethylbutanoic acid.

18. The polishing method for polishing a substrate with a polishing liquid for CMP according to claim 15, wherein a content of the saturated monocarboxylic acid is 0.01 to 5 parts by mass based on 100 parts by mass of the polishing liquid for CMP.

19. A polishing method for polishing a substrate with a polishing liquid for CMP, the polishing method comprising the steps of:
   (A) providing a polishing liquid for CMP that comprises
      (I) an abrasive grain;
      (II) an additive; and
      (III) a water;
   wherein the abrasive grain comprises a cerium-based particle,
   wherein the additive comprises
      (a) a 4-pyrone-based compound represented by a following formula (1);

(b) at least one of a nonionic surfactant or a cationic surfactant; and
(c) a saturated mono carboxylic acid;

[Chemical Formula 1]

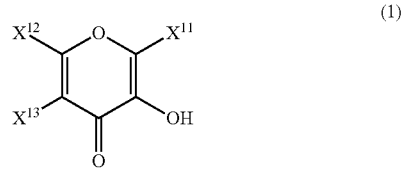

(1)

wherein $X^{11}$, and $X^{12}$, of formula(1) each independently represent a hydrogen atom or a monovalent substituent;
(B) providing a substrate and a polishing member, wherein the substrate has an insulating film on a surface of the substrate;
(C) feeding the polishing liquid for CMP between the insulating film on the substrate and a polishing member; and
(D) polishing the insulating film on the substrate with the polishing member.

20. The polishing method for polishing a substrate with a polishing liquid for CMP according to claim 19, wherein the 4-pyrone-based compound is at least one compound selected from the group consisting of 3-hydroxy-2-methyl-4-pyrone, 5-hydroxy-2-(hydroxymethyl)-4-pyrone, and 2-ethyl-3-hydroxy-4-pyrone.

21. The polishing method for polishing a substrate with a polishing liquid for CMP according to claim 19, wherein the nonionic surfactant is at least one surfactant selected from the group consisting of an ether-type surfactant, an ester-type surfactant, an aminoether-type surfactant, an ether ester-type surfactant, an alkanolamide-type surfactant, polyvinylpyrrolidone, polyacrylamide, and polydimethylacrylamide.

22. The polishing method for polishing a substrate with a polishing liquid for CMP according to claim 19, wherein the saturated monocarboxylic acid has 2 to 6 carbon atoms.

23. The polishing method for polishing a substrate with a polishing liquid for CMP according to claim 19, wherein the saturated monocarboxylic acid is at least one compound selected from the group consisting of acetic acid, propionic acid, butyric acid, isobutyric acid, valeric acid, isovaleric acid, pivalic acid, hydrangelic acid, caproic acid, 2-methylpentanoic acid, 4-methylpentanoic acid, 2,3-dimethylbutanoic acid, 2-ethylbutanoic acid, 2,2-dimethylbutanoic acid, and 3,3-dimethylbutanoic acid.

24. The polishing method for polishing a substrate with a polishing liquid for CMP according to claim 19, wherein a pH of the polishing liquid for CMP is less than 9.

25. The polishing method for polishing a substrate with a polishing liquid for CMP according to claim 19, wherein a pH of the polishing liquid for CMP is less than 8.

26. The polishing method for polishing a substrate with a polishing liquid for CMP according to claim 19, wherein a pH of the polishing liquid for CMP is less than 7.

27. The polishing method for polishing a substrate with a polishing liquid for CMP according to claim 19, wherein the pH of the polishing liquid for CMP is not less than 1.5.

28. The polishing method for polishing a substrate with a polishing liquid for CMP according to claim 19, wherein the pH of the polishing liquid for CMP is not less than 2.0.

29. The polishing method for polishing a substrate with a polishing liquid for CMP according to claim 19, wherein the pH of the polishing liquid for CMP is not less than 2.5.

30. The polishing method for polishing a substrate with a polishing liquid for CMP according to claim 19, wherein the polishing liquid for CMP further comprises a pH adjuster.

31. The polishing method for polishing a substrate with a polishing liquid for CMP according to claim 19, wherein a content of the 4-pyrone-based compound of the polishing liquid for CMP is 0.01 to 5 parts by mass based on 100 parts by mass of the polishing liquid for CMP.

32. The polishing method for polishing a substrate with a polishing liquid for CMP according to claim 19, wherein a content of at least one of the nonionic surfactant or the cationic surfactant of the polishing liquid for CMP is 0.05 to 0.5 parts by mass based on 100 parts by mass of the polishing liquid for CMP.

33. The polishing method for polishing a substrate with a polishing liquid for CMP according to claim 19, wherein a content of the saturated monocarboxylic acid is 0.01 to 5 parts by mass based on 100 parts by mass of the polishing liquid for CMP.

34. The polishing method for polishing a substrate with a polishing liquid for CMP according to claim 19, wherein a content of the abrasive grain of the polishing liquid for CMP is 0.01 to 10 parts by mass based on 100 parts by mass of the polishing liquid for CMP.

35. The polishing method for polishing a substrate with a polishing liquid for CMP according to claim 19, wherein an average particle size of the abrasive grain of the polishing liquid for CMP is 50 to 500 nm.

36. The polishing method for polishing a substrate with a polishing liquid for CMP according to claim 19, wherein the cerium-based particle of the abrasive grain of the polishing liquid for CMP comprises cerium oxide.

37. The polishing method for polishing a substrate with a polishing liquid for CMP according to claim 19, wherein the cerium-based particle of the abrasive grain comprises polycrystalline cerium oxide that has a grain boundary.

38. The polishing method for polishing a substrate with a polishing liquid for CMP according to claim 19, wherein the insulating film is a silicon oxide film.

39. The polishing method for polishing a substrate with a polishing liquid for CMP according to claim 19, wherein a surface of the insulating film has a depression and a projection, and wherein the polishing step (D) flattens the surface of the insulating film.

* * * * *